(12) United States Patent
Thiagarajan et al.

(10) Patent No.: US 10,033,403 B1
(45) Date of Patent: Jul. 24, 2018

(54) INTEGRATED CIRCUIT DEVICE WITH RECONFIGURABLE DIGITAL FILTER CIRCUITS

(71) Applicant: Cypress Semiconductor Corporation, San Jose, CA (US)

(72) Inventors: Eashwar Thiagarajan, Bellevue, WA (US); Jean-Paul Vanitegem, San Jose, CA (US); Harold M. Kutz, Edmonds, WA (US); Anasuya Pai Maroor, Woodinville, WA (US); Kendall V. Castor-Perry, Seattle, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/736,488

(22) Filed: Jun. 11, 2015

Related U.S. Application Data

(60) Provisional application No. 62/084,151, filed on Nov. 25, 2014.

(51) Int. Cl.
  *H03M 3/00* (2006.01)
  *H03H 17/04* (2006.01)
  *H03H 17/06* (2006.01)

(52) U.S. Cl.
  CPC ........ *H03M 3/462* (2013.01); *H03H 17/0416* (2013.01); *H03H 17/0621* (2013.01); *H03M 3/466* (2013.01)

(58) Field of Classification Search
  CPC ........... H03H 17/0286; H03H 17/0288; H03H 17/0294
  See application file for complete search history.

(56) References Cited

U.S. PATENT DOCUMENTS

| 4,881,191 | A | 11/1989 | Morton |
| 5,388,062 | A * | 2/1995 | Knutson ............... 708/323 |
| 5,724,037 | A | 3/1998 | Lee |
| 6,317,765 | B1 | 11/2001 | Page et al. |
| 8,107,760 | B2 | 1/2012 | Hier |
| 2002/0063588 | A1 | 5/2002 | Page et al. |
| 2003/0037083 | A1* | 2/2003 | Todsen et al. ............ 708/313 |
| 2003/0154357 | A1* | 8/2003 | Master et al. ............ 712/15 |
| 2004/0225809 | A1 | 11/2004 | Wee et al. |
| 2006/0133551 | A1* | 6/2006 | Davidoff et al. .......... 375/350 |
| 2012/0110051 | A1* | 5/2012 | Mathai et al. ............ 708/316 |
| 2013/0120178 | A1* | 5/2013 | Murakami et al. ........ 341/155 |

OTHER PUBLICATIONS

Altera Corporation, AN 623: Using the DSP Builder Advanced Blockset to Implement Resampling Filters, Application Note, Aug. 2010.
Laddomada, Massimiliano, On the Polyphase Decomposition for Design of Generalized Comb Decimation Filters, arXiv.org, Jul. 17, 2007.

* cited by examiner

*Primary Examiner* — Chuong D Ngo

(57) ABSTRACT

An integrated circuit device can include at least one input; at least one output configured to provide a multi-bit output value; at least one input; at least one output configured to provide a multi-bit output value; a plurality of configurable digital filter circuits; and switch circuits coupled to the at least one input and to the at least one output, the switch circuits configurable to connect same digital filter circuits as a single processing path or separate processing paths.

20 Claims, 9 Drawing Sheets

FIG. 5
| CFG# | 2 Separate Decimators | |
|---|---|---|
| 1 | Sinc1 | Sinc1 |
| 2 | Sinc1 | Sinc2 |
| 3 | Sinc2 | Sinc1 |
| 4 | Sinc2 | Sinc2 |
| 5 | Sinc3 | Sinc1 |
| | 2 Chained Decimators | |
| 6 | Sinc1 | Sinc1 |
| 7 | Sinc2 | Sinc1 |
| 8 | Sinc3 | Sinc1 |
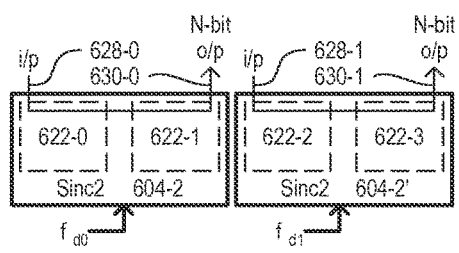
FIG. 6A
CFG#4
(2 indepedent Sinc2)
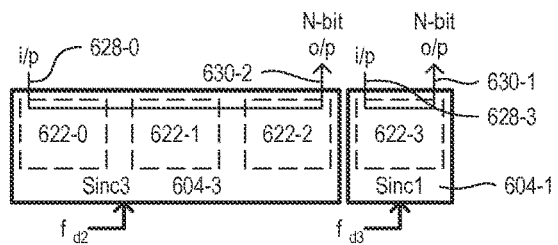
FIG. 6B
CFG#5
(Independent Sinc3 and Sinc1)
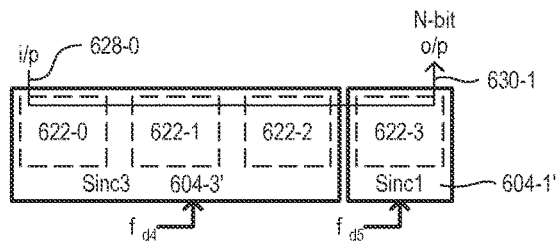
FIG. 6C
CFG#8
(Chained Sinc3 and Sinc1)
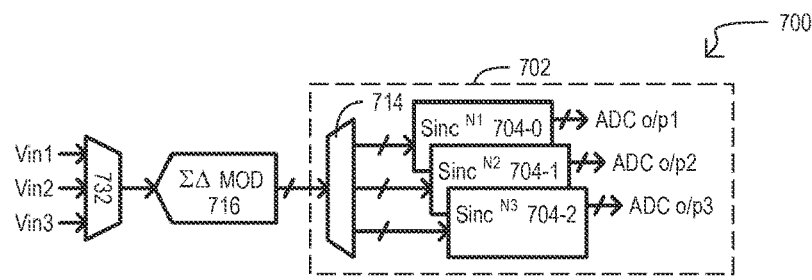
FIG. 7

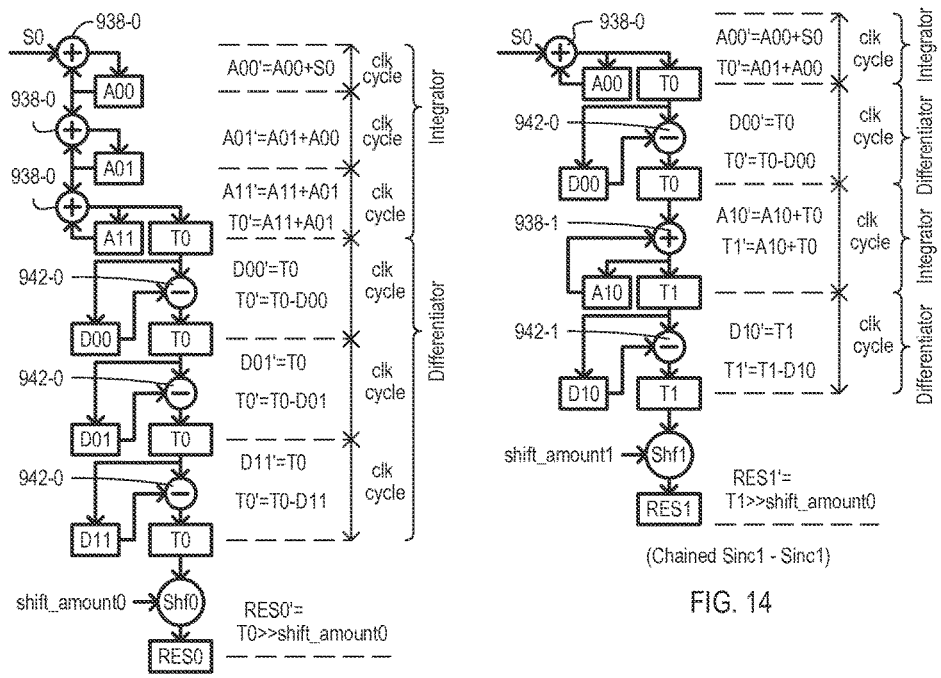
FIG. 13
FIG. 14 (Chained Sinc1 - Sinc1)
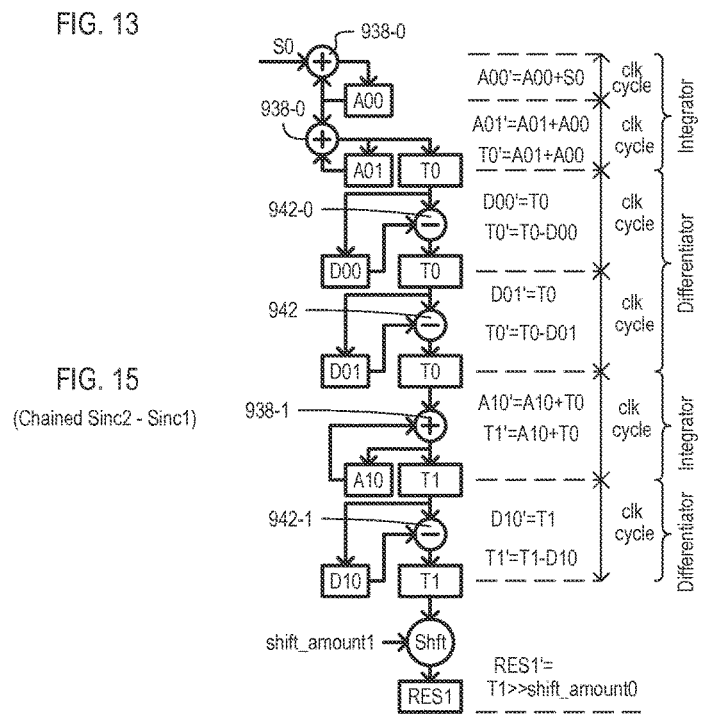
FIG. 15 (Chained Sinc2 - Sinc1)

US 10,033,403 B1

INTEGRATED CIRCUIT DEVICE WITH RECONFIGURABLE DIGITAL FILTER CIRCUITS

CROSS-REFERENCE TO RELATED APPLICATIONS

This application claims the benefit of U.S. Provisional Patent Application Ser. No. 62/084,151 filed on Nov. 25, 2014, the contents of which are incorporated by reference herein.

TECHNICAL FIELD

The present disclosure relates generally to integrated circuit (IC) devices having configurable sections, and more particularly to IC devices having digital filter circuits programmable into various configurations.

BACKGROUND

Data converter circuits, such as analog-to-digital converters (ADCs) can include circuits for processing a digital signal once it has been sampled. For example, in sigma-delta type ADCs, a sigma-delta modulator can generate a modulated bit stream which can then be sampled and digitally filtered. Conventionally, many IC devices include circuits designed for a particular type of filtering. For example, some conventional ADCs can include a sigma-delta modulator followed by a decimation (or sinc) filter circuit designed for a particular response. In particular, a decimation filter can be designed for a frequency response based on the noise shaping presented by the sigma-delta modulator. A limitation to conventional digital filter approaches can be limited flexibility. A digital filter can be designed for a particular application. Accordingly, to accommodate other applications can require additional value integrated circuit (IC) device area.

Digital filter functions can also be realized by code executed by a processor (e.g., firmware of a system). However, firmware based digital filtering can be slower in performance than a digital filter circuit, and can tie up processor resources and consume processor power. Further, accommodating different filter types may require additional code, or delays as new code is loaded between the implementation of different filter types.

BRIEF DESCRIPTION OF THE DRAWINGS

FIG. 5 is a table showing possible configurations of a configurable filter section according to a particular embodiment.

FIGS. 6A to 6C are diagrams showing sinc filter configurations according to various embodiments.

FIG. 7 is a block diagram of a multiplexing ADC according to an embodiment.

FIG. 13 is a diagrams of a sinc3 filter operation according to an embodiment.

FIG. 14 is a diagram of the operation of two chained sinc1 filters according to an embodiment.

FIG. 15 is a diagram of the operation of chained sinc2 and sinc1 filters according to an embodiment.

DETAILED DESCRIPTION

Figure 1A:
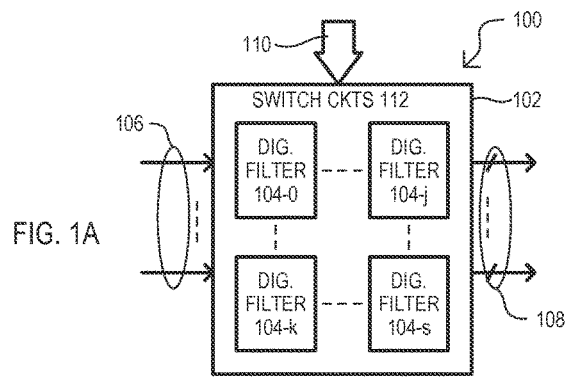
FIGS. 1A to 1C are block diagrams of an integrated circuit (IC) device and various configurations according to embodiments.

Various embodiments will now be described that show integrated circuit (IC) devices that can include multiple configurable digital filter circuits that are both separable and combinable according to configuration data to enable a wide variety of digital filtering functions. In some embodiments, the digital filter circuits can be created by reconfigurable circuit sections that can combined to create filters with different characteristics, including but not limited to decimation filters with selectable orders of decimation and decimation ratios. In particular embodiments, such filtering can be used in conjunction with a reconfigurable sigma-delta modulator to provide a sigma-delta analog-to-digital converter (ADC) that can accommodate various modulation schemes.

In some embodiments, an IC device can provide multiple bit streams to the configurable digital filter circuits, including those arising on the IC device, and those arriving from a source external to the IC device. In a particular embodiment, such switching between bit streams can enable essentially zero latency ADC multiplexing (MUXing).

In the particular embodiments described herein, like items are referred to by the same reference character but with the leading digit(s) corresponding to the figure number.

Figures 1B, 1C:
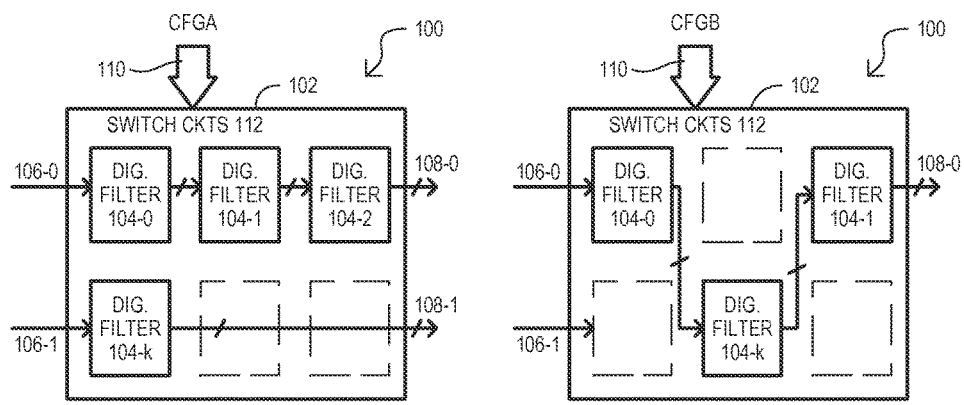

FIGS. 1A to 1C are a series of block diagrams showing an IC device according to particular embodiments. IC device 100 can include a configurable filter section 102, one or more inputs 106, one or more outputs 108, switch circuits 122, and a configuration data input 110. A filter section 102 can include multiple digital filter circuits 104-0 to -s that can be reconfigured into numerous digital processing paths. Further, such configurations can be separable, providing multiple different processing paths, or combinable, chaining processing paths together. In some embodiments, filter circuits (104-0 to -2) can each provide a particular filter function. However, as will be shown in more detail herein, in other embodiments filter circuits (104-0 to -2) can be circuit blocks, or sections, that provide only part of a filter function (e.g., integrator, differentiator, etc.).

In some embodiments, input(s) 102 can receive input bit streams for processing. An input bit stream 106 can be a modulated bit stream representing some other input signal. As but one example, an input bit stream 106 can correspond to the output of a sigma-delta modulator circuit. It is understood that an input bit stream 106 need not be (or be derived from) a two state signal, and can include bit streams generated from a multi-bit modulation operation. Outputs 108 can be multi-bit outputs.

Switch circuits 112 can include multiple switching paths between the filter circuits (104-0 to -s) that can be enabled and disabled according to configuration data received at configuration data input 110. Such switching paths can include various switch circuits, including MUXs and de-multiplexers (de-MUXs), as but two examples. In this way, filter circuits (104-0 to -s) can be interconnected according to configuration data to provide any of a large number of different configurations. In some embodiments, switch circuits 112 can include (or be configured into) one or more input MUXes to switch any of inputs 106 to particular a filter circuit(s) (104-0 to -s). In addition or alternatively, switch circuits 112 can include (or be configured into) one or more output MUXes to switch outputs from filter circuit(s) (104-0 to -s) to one or more of the outputs 108. Along these same lines, switch circuits 112 can include (or be configured into) one or more de-MUXs to switch outputs from any of multiple filter circuits (104-0 to -s) to one of the outputs 108.

In some embodiments, switch circuits 112 are reconfigurable, providing different configurations with each new set of configuration data. Further, reconfiguration can occur on the fly (while the IC device is in operation) or may require particular events (a reset and/or programming step). However in other embodiments, switch circuits 112 may be one time configurable.

In a particular embodiment, all sections of IC device 100 can be formed in a same IC substrate.

While an IC device 100 can be configured in various arrangements, FIGS. 1B and 1C show particular configurations by way of example. FIG. 1B shows IC device 100 configured in response to configuration data CFGA. Filter circuits (104-0/1/2) are connected in series to form one processing path, while filter circuit 104-k provides its own, separate signal path. As noted above, filter circuits (104-0/1/2) can be full filters, or circuit sections that perform partial filter functions. Accordingly, the processing path formed by filter circuits (104-0/1/2) can represent a single filter circuit, three filter circuits in series, or some arrangement in between.

FIG. 1C shows IC device 100 configured in response to configuration data CFGB. Filter circuits (104-0/k/j) are connected in series to form one processing path. Thus, the configuration of FIG. 1C includes the repurposing of filter circuits 104-0/k used in the configuration of FIG. 1B.

It is noted that configuration data (e.g., CFGA/B) can be the signals utilized to control switch elements within switch circuits 112, or can be data values that are stored by switch circuits 112 and used to control switch elements. It is further noted that configuration data (e.g., CFGA/B) may not only control how filter circuits (104-0 to -s) are interconnected, but can also control the characteristics of such filters. As will be shown in more detail herein, such characteristics can include, but are not limited to: decimation order, decimation ratio, or zero placement.

Figure 2:
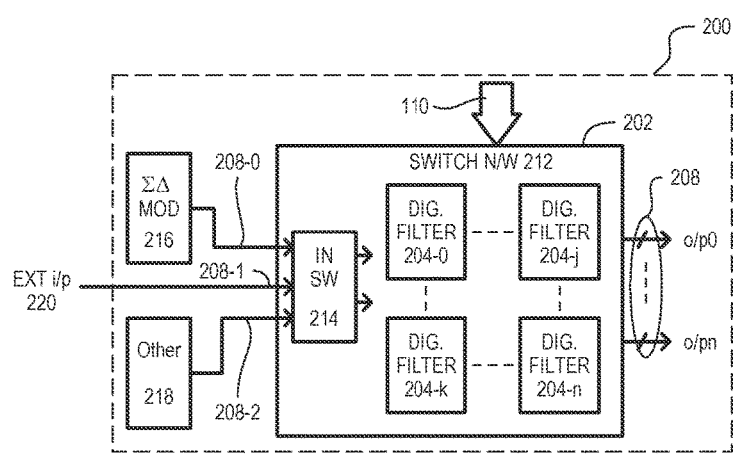
FIG. 2 is a block schematic diagram of an IC device according to another embodiment.

FIG. 2 is a block diagram of an IC device 200 according to another embodiment. FIG. 2 differs from FIG. 1A in that IC device 200 shows three particular inputs 208-0/1/2 that are provided to an input switch circuit 214 included in (or formed by) switch circuits 212. Input 208-0 can provide a bit stream from a sigma-delta modulator circuit 216 included within the IC device 200. Input 208-1 can provide an input from a source external to the IC device 200. Input 208-2 can provide an input from another circuit 218 of the same IC device 200. As understood form above, signals received on inputs (208-0/1/2) can be two-level signals, single sampled bit streams, or multi-bit sampled bit streams. In some embodiments, either of the sigma-delta modulator circuit 216 or the other circuit 218 can be formed in the same IC substrate as the configurable filter section 102. However, in alternate embodiments, such circuits can be formed in a same IC device package, but different substrates.

In this way, any of multiple input sources, including that form a sigma-delta modulator, can be switched into a configurable filter section 202 for processing.

As noted above, in some embodiments, a configurable filter section (e.g., 102, 202) can include circuit blocks or sections that each perform partial filter functions, which can be interconnected to form digital filters having various characteristics.

Figure 3A:
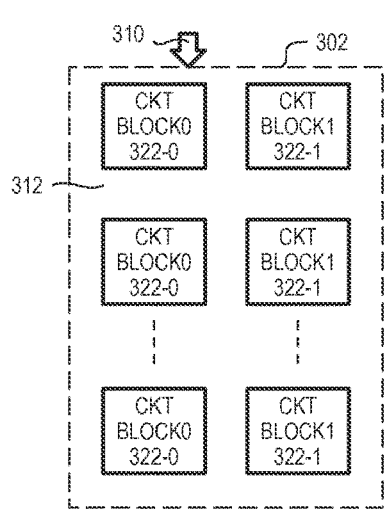
FIGS. 3A to 3D are block diagrams of a configurable circuits section and various configurations according to embodiments.

FIGS. 3A to 3D are block diagrams showing a configurable circuit section that can include circuit blocks that can be interconnected with one another. FIG. 3A shows a configurable filter section 302 according to one embodiment that includes two different types of circuit blocks 322-0 and 322-1 arranged within switch circuits 312. According to configuration data received at configuration data input 310, the circuit blocks (322-0/1) can be interconnected (or separated). In the embodiment shown, it is assumed that circuit blocks 322-0/1 can be connected to form different orders of a same filter type.

Figure 3B:
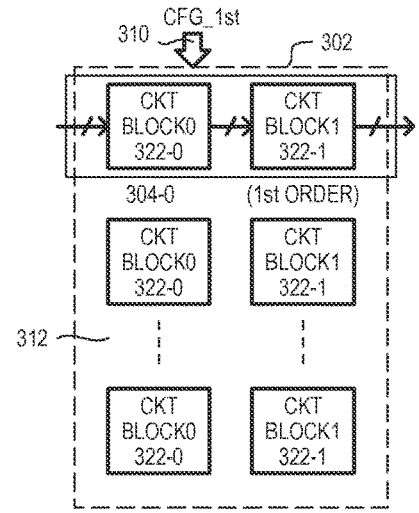
Figure 3C:
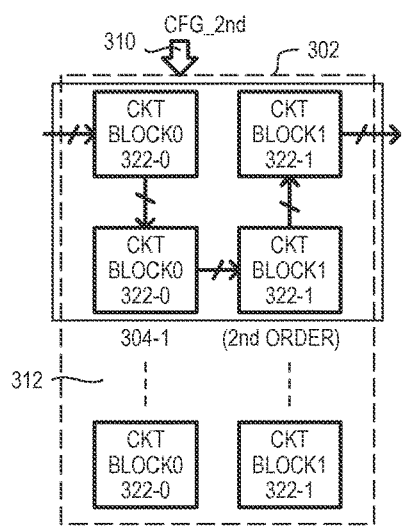
Figure 3D:
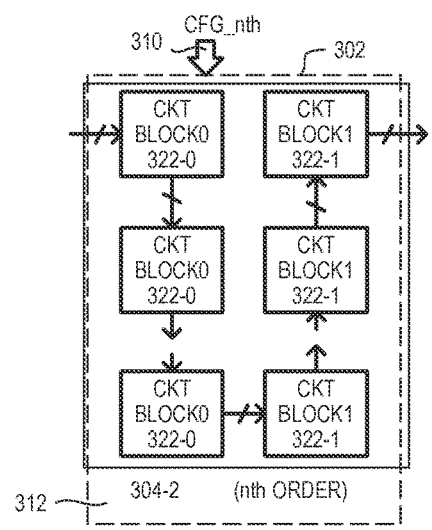

In particular, FIG. 3B shows switch circuits 312, in response to configuration data CFG_1st connecting one circuit block 322-0 with another circuit block 322-1 to form a first order filter 304-0. FIGS. 3C and 3D show how circuit blocks can be further chained together to from filters of increasingly higher order. FIG. 3C shows a second order filter 304-1 formed according to configuration data $CFG\_2^{nd}$. FIG. 3D shows an nth order filter 304-2 formed according to configuration data CFG_nth.

While embodiments can include configurable filter circuits for various applications, in some embodiments, a configurable filter section can provide decimation (i.e., sinc) type filters of varying orders and/or decimation ratios. While such configurable sinc filters can have various applications, in particular embodiments sinc filters can be included in a configurable oversampling ADC circuit.

Figure 4:
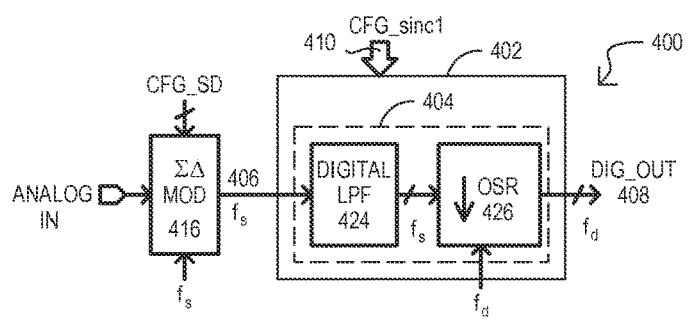
FIG. 4 is a block diagram of a sigma-delta analog-to-digital converter (ADC) according to an embodiment.

FIG. 4 shows an IC device 400 according to one embodiment. An IC device 400 can form a configurable ADC circuit. IC device 400 can include a sigma-delta modulator circuit 416 that provides an input bit stream to a sinc (decimation) filter 404 formed all or in part by a configurable filter section 402. Sigma-delta modulator 416 can receive an analog input signal (ANALOG IN), and generate a modulated signal (or bit stream) at a sampling rate $f_s$. In some embodiments, sigma-delta modulator 416 may itself be configurable in response to configuration data CFG_SD. Different configurations can include, but are not limited to, orders of modulation and sampling rate.

Sinc filter 404 can be configurable, as described herein and equivalents. This can be particularly advantageous when sigma-delta modulator 416 is configurable, as the sinc filter 404 can be configured to meet the particular digital processing needs of modulation being used. In the embodiment shown, sinc filter 404 can be a first order sinc filter formed within configurable filter section 402 in response to configuration data CFG_sinc1. Sinc filter 404 can be conceptualized as including a digital low pass filter 424 and downsampler circuit 426. However, it is understood that higher order sinc filters can be formed by reconfiguring configurable filter section 402. Downsampler circuit 426 can sample filtered values at a rate $f_d$, which can be slower than sigma-delta sampling rate $f_s$. Such digital values (DIG_OUT) can be provided on output 408 at the downsampled rate $f_d$.

FIG. 5 is a table showing one very particular example of a filtering selection scheme for a configurable filter section according to a particular embodiment. FIG. 5 shows eight different configurations divided into two groups. A first group, composed of configurations 1 to 5, has variations on two separate sinc filters that can operate independently of one another ("2 Separate Decimators"). A second group, composed of configurations 6 to 8, has variations on two sinc filters connected in series ("2 Chained Decimators"). The sinc filters vary from first order filters (Sinc1) to third order filters (sinc3). Each different configuration (CFG#) can correspond to configuration data sent to switch circuits which can interconnect various circuit blocks/sections to arrive at the indicated independent filter pair or chained filter pair. The combination of dual sinc filters can be considered a flexible "dual decimator" architecture.

While FIG. 5 shows configurations of two sinc filters ranging from first order (sinc1) to third order (sinc3), alternate embodiments can include greater or fewer numbers of filters of lower or higher orders.

FIGS. 6A to 6C show particular implementations of some of the configurations shown in FIG. 5 according to particular embodiments. Each of FIG. 6A to 6C shows the repurposing of circuit blocks 622-0 to 622-3 to arrive at various filter configurations.

FIG. 6A shows configuration #4 from FIG. 5, which includes two, separate sinc2 filters 604-2 and 604-2'. As shown, sinc2 filter 604-2 can be formed with circuit blocks 622-0/1 configured together, with circuit block 622-0 having a filter input 628-0 and circuit block 622-2 having a filter output 630-0. The other sinc2 filter 604-2' is formed in a similar fashion using circuit blocks 622-2/3. Sinc2 filter 604-2 can downsample at a rate $f_{d0}$, while sinc2 filter 604-2' can downsample at a rate $f_{d1}$. It is noted that while downsample rates $f_{d0}$ and $f_{d1}$ could be the same, they may also be different to provide an entirely different response for the two filters 604-2/2'.

FIG. 6B shows configuration #5 from FIG. 5, which includes a separate sinc3 filter 604-3 and a separate sinc1 filter 604-1. As shown, sinc3 filter 604-3 can be formed with circuit blocks 622-0/1/3 configured together, with circuit block 622-0 having a filter input 628-0 and circuit block 622-3 having a filter output 630-2. The sinc1 filter 604-1 can be formed with circuit block 622-3 having both a filter input 628-3 and a filter output 630-1. Sinc3 filter 604-3 can have a downsample rate of $f_{d2}$, while sinc1 filter 604-1 can downsample rate of $f_{d3}$. Again, downsample rates $f_{d2}$ and $f_{d3}$ can be different from one another.

FIG. 6C shows configuration #8 from FIG. 5, which includes a sinc3 filter 604-3' chained in series with a sinc1 filter 604-1'. Sinc3 filter 604-3 can be formed with circuit blocks 622-0/1/3 and sinc1 filter 604-1' can be formed with circuit block 622-3, as in FIG. 6B. Circuit block 622-0 can have a filter input, while circuit block 622-3 can have the filter output 630-1. The downsample rates $f_{d4}$ and $f_{d5}$ can be the same or different from one another. Chaining of filters can trade performance (i.e., signal-to-noise ratio, SNR) for speed. Further, as will be shown in other embodiments below, chaining can also enable further signal processing to alter or compensate for undesirable features of previous filter stage(s). As but one example, a filter chained after a sinc3 filter can be used to compensate for the "droop" that can occur in the passband of the sinc3 filter.

Referring still to FIGS. 6A to 6C, the ability to configure sinc filters of various orders can not only accommodate different sigma-delta modulations types in an ADC, but can also accommodate different sigma-delta ADC conversion modes. Oversampling ADCs can have two different modes of operation: an incremental (or one-shot, or single-sample) mode and a continuous mode. In an incremental mode, at the end of a conversion, the result can be stored and conversion operations stopped. In contrast, in a continuous mode, the ADC can continuously produce output data until operations are ceased. If the sigma-delta modulator is of order "L", then the corresponding sinc (decimation) filter should be of order "L+1" in a continuous mode of operation, or "L" in the incremental mode of operation. Accordingly, the ability to interconnect circuit blocks as represented in FIGS. 6A to 6C can enable an IC device to meet various orders of filtering as needed for the particular mode of operation.

Still further, at high speeds of operation, the described dual decimator architecture can be expanded to correct offset and gain error in ADCs and/or delta-sigma digital-to-analog converters (DACs).

FIG. 7 shows an IC device 700 according to another embodiment. IC device 700 can provide a zero latency oversampling ADC MUXing scheme. An IC device 700 can include an analog input MUX 732, a sigma-delta modulator circuit 716, a bit stream de-MUX 714, and multiple sinc filters 704-0 to 704-2. Sinc filters 704-0 to -2 can be formed by switching circuits and circuit blocks/sections as described herein or equivalents. The order of each sinc filter (704-0 to -2) can be configurable, and selected according the particular conversion operation. A bit stream de-MUX 714 may, or may not be formed from switching circuits.

In operation, various analog input signals, in this case voltage Vin1, Vin2 and Vin3 can be selectively applied to sigma-delta modulator circuit 716, which can generate a corresponding bit stream according to a selected modulation scheme. It is noted that sigma-delta modulator can apply a different modulation scheme to each different input (Vin1, Vin2 and Vin3).

Different bit streams from sigma-delta modulator 716 (which can correspond to different analog input signals) can be applied to the appropriate sinc filter 704-0 to -2, which can generate a corresponding multi-bit output (ADC o/p1 to o/p3). Accordingly, each output can have a different resolution, or correspond to a different sampling rate (from sigma-delta modulator 716) and/or different downsampling rate(s) (from the selected sinc filter 704-0 to -2).

Having described various embodiments of configurable sinc filters and devices including such filters, more detailed sinc filters according to embodiments will now be described.

Figure 8:
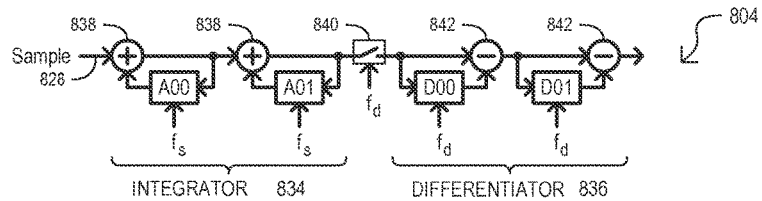
FIG. 8 is a block diagram of a second order sinc (sinc2) filter according to an embodiment.

FIG. 8 shows a sinc2 filter 804 according to an embodiment. Sinc filters in general can include an integrator section (e.g., 834) and differentiator section (e.g., 836). An integrator section (e.g., 834) can include stages formed by additions 838 and corresponding accumulator register (two in this example, A00, A01). The number of such stages determines the order of the sinc filter. For example, a sinc1 filter would have one addition and corresponding accumulator register, while a sinc3 filter would have three such additions corresponding accumulator registers. An integrator section (e.g., 834) can receive 1-bit samples at a sample rate $f_s$ (e.g., a modulation bit stream). Based on such bit stream values, accumulator registers (e.g., A00, A01) can accumulate values. One bit stream value (e.g., high) can translate into +1, while the other bit stream value (e.g., low) can translate into a −1. Each accumulator register (e.g., A00, A01) contain the results of a previous integration iteration. Accumulation registers (A00, A01) can operate at the sampling frequency $f_s$.

Values from an integrator section 834 can be clocked into differentiator section 836 at a downsampling rate $f_d$, shown by downsample 840. A differentiator section (e.g., 836) can include stages formed by a subtraction 838 and corresponding storage registers (two in this example, D00, D01). As in the case of the integrator section (e.g., 834), the number of such stages determines the order of the sinc filter (i.e., a sinc1 filter would have one subtraction and one register, a sinc3 filter would have three subtractions and three registers, a sincn filter would have n subtractions and registers).

Integrated values within integrator section (e.g., 834) can be clocked into the differentiator section (e.g., 836) by downsample switch circuit 840. Downsample switch circuit 840, and operations within the differentiator section (e.g., 836) occur at a downsampled rate $f_d$, where $f_d < f_s$. Thus, a differentiator section (e.g., 836) is activated once the decimation ratio ($f_s/f_d$) is reached. Each differentiator register (e.g., D00, D01) contain the results of a previous differentiation iteration.

It is understood that some or all of the circuit sections/blocks of FIG. 8 can be interconnected via configurable switch circuits. Further, fewer or larger numbers of components can be interconnected to achieve lower or higher order sinc filters.

Referring still to FIG. 8, it can be observed that the result of an integration addition is both stored in an accumulator register (A00, A01) for the next integration iteration and is needed for the next addition if there is a following stage. So, with the next addition occurring in the next clock cycle that same accumulator register can conveniently also be used for that computation.

Unfortunately for the differentiation portion of sinc register, this does not apply. As can be seen in FIG. 8, all subtraction and register updates need to happen in parallel to avoid losing a value. According to embodiments herein, sinc filters can include a temporary value register to store differentiation results for use between subsequent clock cycles.

Figure 9:
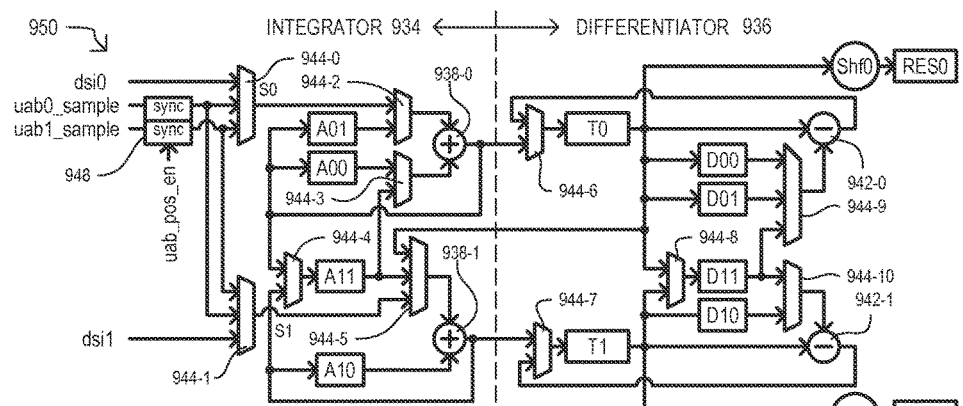
FIG. 9 is a block diagram of a dual decimator architecture for providing configurable filters according to a particular embodiment.

FIG. 9 is a block schematic diagram of a dual-decimator architecture 950 of an IC device according to one very particular embodiment. Dual-decimator architecture 950 can be capable of accommodating all of the various configurations shown in FIG. 5.

In the particular embodiment shown, a dual-decimator architecture 950 can receive bit streams from any one of four different input sources, shown as dsi0, dsi1, uab0_sample, and uab1_sample. In one very particular embodiment, inputs dsi0 and dsi1 can original from a digital system interconnect that interconnects various digital circuits of the IC device. Inputs uab0_sample and uab1_sample can be from configurable analog circuit blocks that can include, or can be configured into, a modulator, such as a sigma-delta modulator, as but one example. Inputs uab0_sample and uab1_sample can be clocked into the dual-decimator architecture 950 by synchronizing circuits 948 in response to a clock enable signal uab_pos_en. In addition, dual-decimator architecture 950 can provide output results at two result registers (RES0/1). In a very particular embodiment, results can be 32-bit sign extended values.

Dual-decimator architecture 950 can include an integrator portion 934 and differentiator portion 936. Integrator portion 934 can include input MUXs 944-0/1, processing MUXes 944-2/3/4/5, adders 938-0/1, and accumulator registers A00, A01, A10, A11. Input MUX 944-0 can selectively provide any of inputs dsi0, uab0_sample or uab1_sample as an input to processing MUX 944-2. Input MUX 944-1 can selectively provide any of inputs dsi1, uab0_sample or uab1_sample as an input to processing MUX 944-5. Processing MUX 944-2 can have a second input connected to an output of register A01, and an output connected to adder 938-0. Processing MUX 944-3 can have one input connected to an output of register A00, another input connected to an output of register A11, and an output connected to adder 938-0. An output of adder 938-0 can be provided as an input to differentiator section 936, and as an input to processing MUX 944-4, to registers A00, and to register A01.

Referring still to integrator portion 934, register A11 can have an input connected to the output of processing MUX 944-4, and an output connected to inputs of processing MUXs 944-3 and 944-5. Processing MUX 944-5 can have an output connected to adder 938-1. Adder 938-1 can have an output connected to an input of register A10 and processing MUX 944-4.

To enable a chaining of sinc filters, processing MUX 944-5 can further have an input connected to temporary register T0 within differentiator portion 936. Such an arrangement can enable an output of one sinc filter formed within the architecture 950 to be applied back to an input of another sinc filter within the architecture 950. It is understood that operations within integrator portion 934 can occur at a sampling rate $f_s$.

Differentiator portion 936 can include input MUXs 944-6/7, processing MUXes 944-8/9/10, subtractions 942-0/1, registers D00, D01, D10, D11, temporary registers T0/1, shift circuits Shf0/1, and result registers RES0/1. Input MUX 944-6 can selectively provide an output of adder 938-0 or an output of subtraction 942-0 to temporary register T0. An output of temporary register T0 can be connected to shift circuit Shf0, subtraction 942-0, registers D00, register D01, processing MUX 944-8, and back to an input of processing MUX 944-5 within integrator portion 934, as noted above. Output of register D00 can be provided as an input to processing MUX 944-9. Output of register D01 can be provided as another input to processing MUX 944-9. An output of processing MUX 944-9 can be connected to subtraction 942-0.

Referring still to differentiator portion 936, input MUX 944-7 can selectively provide an output of adder 938-1 or an output of subtraction 942-1 to temporary register T1. An output of temporary register T1 can be connected to shift circuit Shf1, subtraction 942-1, register D10, and an input of processing MUX 944-8. Processing MUX 944-8 can have an output connected to register D11. Register D11 can have an output connected to inputs of processing MUXs 944-9 and 944-10. An output of processing MUX 944-10 can be connected to subtraction 942-1.

Processing MUXs 944-8 and 944-9 can enable a sinc3 filter, by including register D11 into differentiation iterations with subtraction 942-0 and registers D00 and D01.

Shift circuit Shf0 can have an output connected to result register RES0. Shift circuit Shf1 can have an output connected to result register RES1. Shift circuits (Shf0/1) can shift an input value by a predetermined amount. In a very particular embodiment, shift values can range from 0 to 16.

It is understood that operations within differentiator portion 936 can occur at a downsampling rate $f_d$. In a particular embodiment, a downsampling rate $f_d$ and/or sampling rate $f_s$ are programmable to enable decimation ratios ($f_s/f_d$) from 1 to 512. However, this is just be way of example. Even higher decimation ratios can be achieved, by dedicating more circuit resources to such circuits, for example.

Examples of sinc filter configurations that can be applied to the dual-decimator architecture 950 will be described in more detail below.

Figure 10:
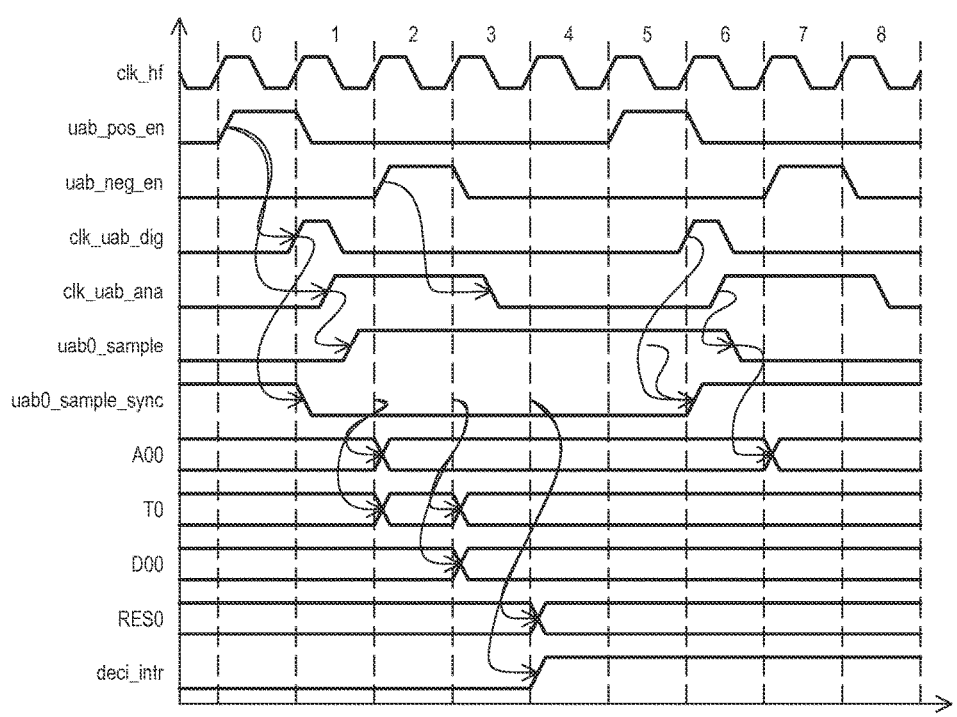
FIG. 10 is a timing diagram of a sinc1 filter operation according to one very particular embodiment.

FIG. 10 is a timing diagram of a sinc1 type filter operation in an architecture like that of FIG. 9, according to one very particular embodiment. FIG. 10 shows the following waveforms clk_fh, which can be a system clock, uab_pos_en, which can be a clock enable signal, uab_neg_en, which can be a clock disable signal, clk_uab_dig, which can be gating clock for a digital input, clk_uab_ana, which can be a divided clock for analog operations, uab0_sample, which can be a sample value, uab0_sample_sync, which can be a synchronized sample value, and deci_intr, which can be a decimator interrupt, to signify conversion operations are over. FIG. 10 also shows the operation of accumulator register A00, temporary register T0, register D00 and result register RES0.

In clock cycles 0 and 1, a sampled value can be synchronized and applied to an integrator portion (e.g., 934). At clock cycle 2, an output from an adder (e.g., 938-0) can be clocked into accumulator register A00 and temporary register T0. This value can represent a sampled value added to a value within accumulator register A00. At clock cycle 3, an output from a subtraction (e.g., 942-0) can be clocked into register D00 and temporary register T0. This value can represent the value stored in D00 subtracted from that in the temporary register T0. At clock cycle 4, the value in register T0 (i.e., a filter output) can be stored in result register RES0 (a shifting operation can also occur). Also at this time, interrupt deci_intr can be activated indicating the end of the single-sample mode conversion operation.

FIGS. 11A to 15 show examples of various sinc filter configurations/operations according to embodiments. While such filters can be implemented with an architecture like that of FIGS. 9 and 17 (described in more detail below), this should not be construed as limiting.

Figure 11A:
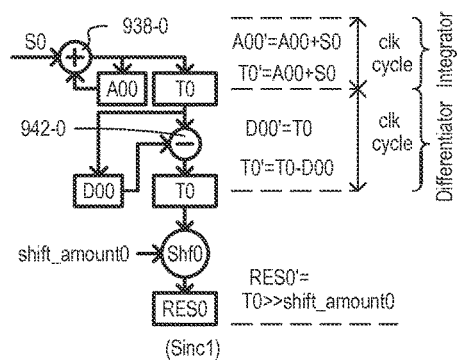
FIGS. 11A and 11B are diagrams of sinc1 filter operations according to embodiments.
Figure 11B:
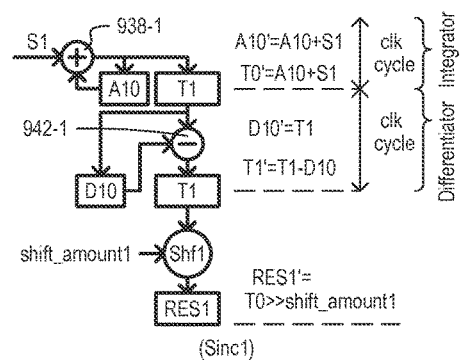

FIGS. 11A and 11B show two independent sinc1 filters according to embodiments. Referring to FIG. 11A, within an integrator section, and at a first sampling rate ($f_s$), an accumulator register A00 can integrate an incoming bit stream by increasing its value according to an input value S0. Such an action can include applying the input value S0 and value stored in register A00 to an adder 938-0, and storing the result back into register A00 (A00'=A00+S0). This value can also be stored in a temporary register (T0'=A00+S0).

Subsequently, within a differentiator section, and at a downsampling rate ($f_d$), a value in register D00 can be subtracted from the value in the temporary register T0 using subtraction 942-0, and the result stored back in register D00 (D00'=T0−D00). This value can also be stored in the temporary register (T0'=T0−D00). In a subsequent clock cycle, the value in temporary register T0 can be shifted by an amount shift_amount0, and stored in a result register (RES0).

FIG. 11B shows an operation like that of FIG. 11A, but with different circuit sections. Accordingly, the operation/configuration of FIG. 11B is understood with reference to the description of FIG. 11A.

Figure 12A:
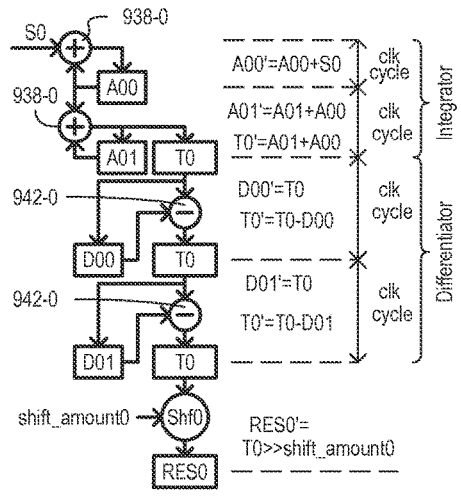
FIGS. 12A and 12B are diagrams of sinc2 filter operations according to embodiments.
Figure 12B:
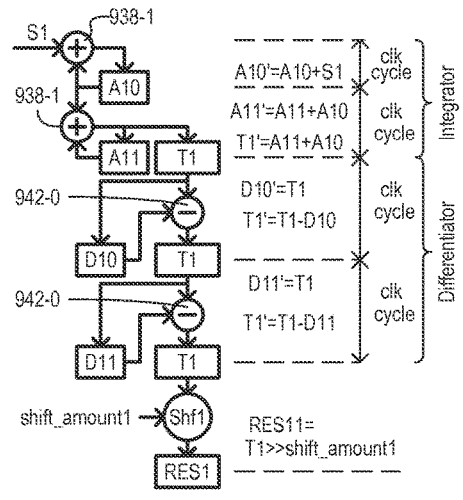

FIGS. 12A and 12B show two independent sinc2 filters according to embodiments. Referring to FIG. 12A, within an integrator section, and at a first sampling rate ($f_s$), an accumulator register A00 can integrate an incoming bit stream by increasing its value according to an input value S0. Such an action can include applying the input value S0 and value stored in register A00 to an adder 938-0, and storing the result back into register A00 (A00'=A00+S0). In a next $f_s$ clock cycle, values in registers A01 and A00 can be added within an adder (e.g., 938-0) and the result stored back in register A01 (A01'=A01+A00). This value can also be stored in a temporary register (T0'=A01+A00).

Subsequently, within a differentiator section, and at a downsampling rate ($f_d$), a value in register D00 can be subtracted from that in the temporary register T0, and the result stored back in register D00 (D00'=T0−D00) and the temporary register (T0'=T0−D00). This process can repeated with the next register: D01'=T0−D01 and T0'=T0−D01). The value in temporary register T0 can be shifted and output as described for the sync1 case of FIG. 11A.

The operation/configuration of FIG. 12B is understood with reference to the description of FIG. 12A.

FIG. 13 shows a sinc3 filter according to an embodiment. A sinc3 filter can perform integrating operations as described for FIG. 12A, but for three stages, using accumulator registers A00, A01 and A11, an adder 938-0, and temporary register T0. Similarly, differentiator operations can occur as described in FIG. 12A, but across three registers D00, D01, D11, a subtraction 942-0, and temporary register T0. The value in temporary register T0 can be shifted and output as described for the sync1 case of FIG. 11A.

FIG. 14 shows a chaining of two sinc1 filters according to an embodiment. Initial sinc1 filtering can occur as described for FIG. 11A, using accumulator register A00, adder 938-0, register D00, subtraction 942-0, and temporary register T0. However, unlike FIG. 11A, the value in temporary register T0 can be fed into a second sinc1 register. Sinc1 filtering then proceed as in FIG. 11B.

FIG. 15 shows a chaining of a sinc2 filter and sinc1 filter according to an embodiment. Initial sinc2 filtering can occur as described for FIG. 12A. However, unlike FIG. 12A, the value in temporary register T0 can be fed into a sinc1 register. Sinc1 filtering then proceed as in FIG. 11B.

Various other chaining arrangements would be understood from the above description. Further, alternate embodiments can include larger order sinc filters chained together, as well as more than two sinc filters chained together.

Figure 16:
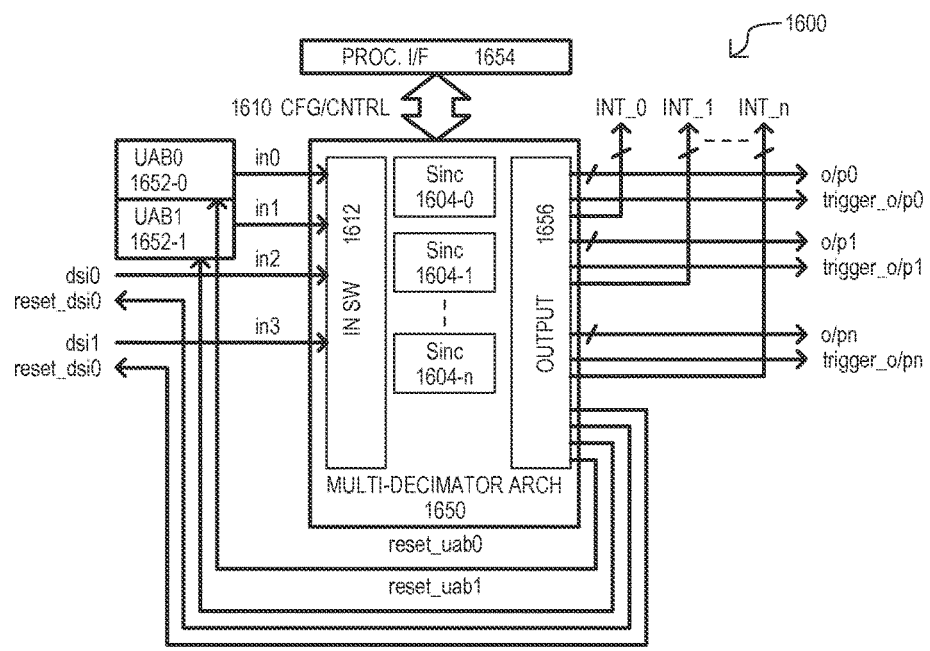
FIG. 16 is a block diagram of an IC device that includes a multi-decimator architecture according to an embodiment.

FIG. 16 is a block schematic diagram of an IC device 1600 according to another embodiment. An IC device 1600 can include a multi-decimator architecture 1650, configurable analog circuit blocks (referred to herein as universal analog blocks, UABs) 1652-0/1, and a processor interface 1654. A multi-decimator architecture 1650 can be reconfigured into multiple sinc filters of different orders and decimation ratios that are both separable and combinable as described herein, or equivalents. In the embodiment shown, multi-decimator architecture 1650 can include various digital filter components 1604-0 to -*n* that can be connected together arrive at various filter configurations, as well as an input switching section 1612 and an output section 1656. Input switching section 1612 can switch in various inputs (in0 to in3) to filters. Output section 1656 can include logic and registers to provide output values, as well as signals indicating the status of filters and/or filtering operations.

UABs 1652-0/1 can be configured to provide various analog functions. In some embodiments, UABs 1652-0/1 can include configurable switched capacitor circuits for discrete time domain operations. UABs 1652-0/1 can include, or be configured into, one or more sigma-delta modulator circuits to serve as front ends of oversampling ADCs. In the embodiment shown, UABs 1652-0/1 can each provide an input (in0/1) to the multi-decimator architecture 1650. The other two inputs (in3/4) can be from a digital system interconnect which can be connected other digital circuits of the IC device 1600.

A processor interface 1654 can be connected to multi-decimator architecture 1650 to provide any of: configuration data, start and/or stop control signals, as well as signals for clearing interrupts (described in more detail below) and/or to retrieve status information for the multi-decimator architecture 1650. In one very particular embodiment, processor interface 1654 can be compatible with the AHB Lite bus specification promulgated by ARM Holding, PLC of Cambridge UK.

Referring still to FIG. 16, in addition to output values o/p0 to o/pn (which can be ADC results in some configurations), multi-decimator architecture 1650 can provide additional signals to indicate the status of circuits or operations therein. In the particular embodiment shown, a set of interrupts INT0 to INTn can be provided for each sinc filter (1604-0 to -*n*). In one particular embodiment, an interrupt set (INT0 to INTn) can include interrupts that indicate any of: a new value is ready (e.g., conversion result) or an overflow condition has occurred (low or high). Such interrupts can be provided to a processor via processor interface 1654 and/or output on a digital system interconnect, noted above.

Multi-decimator architecture 1650 can also provide a trigger signal (trigger_o/p0 to -*n*) for each output. Such trigger signals can be activated when output data are available to enable such data to be accessed (e.g., trigger a direct memory access, DMA, of a memory space accessed by a processor). Still further, reset signals can also be provided for each input source (reset_dsi0/1, reset_uab0/1).

Figure 17:
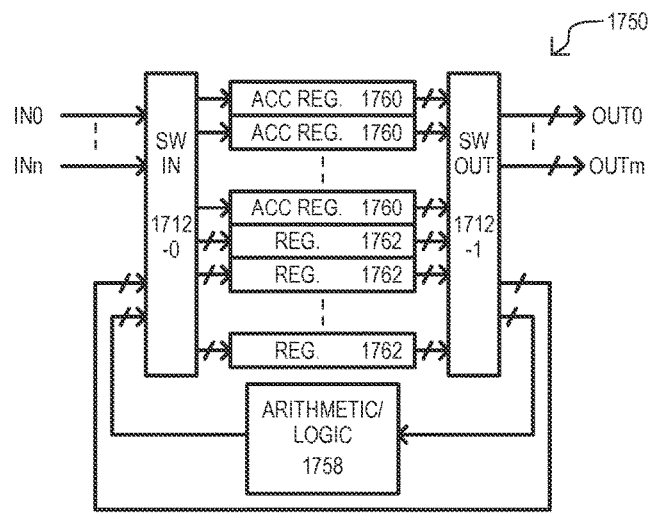
FIG. 17 is a block diagram of a multi-decimator architecture according to an embodiment.

FIG. 17 is a block schematic diagram of a multi-decimator architecture 1750 according to a particular embodiment. Architecture 1750 can include accumulation registers 1760, other registers 1762, input switching circuit 1712-0, and output switching circuit 1712-1. Inputs (IN0 to INn) can be switched into accumulation registers 1760, which can serve as stages in integrator sections of sinc filters. Output switching circuit 1712-1 can switch outputs from registers (1760, 1762) to other registers, the same registers, or an arithmetic logic circuit 1758. In addition, output switching circuit 1712-1 can provide output values OUT0 to OUTN. Registers 1762 can serve as differentiator registers and temporary registers, as described herein and equivalents.

In particular embodiments, a multi-decimator architecture 1750 can be clocked at a frequency substantially higher than a sampling frequency $f_s$, enabling a data values to be time-multiplexed to only a small number of arithmetic logic circuits (e.g., 1758), including only one such circuit, for the computations needed in filtering operations (i.e., additions, subtractions, shifts). It is noted that arithmetic logic circuit 1758 can perform other functions, including multiply functions (using shift and add, for example). The use of multiplier functions will be described in more detail below.

While embodiments can provide filter circuits configurable into one or more sinc filters of varying characteristics, the same configurable circuit components utilized to create sinc filters can be used to form other filtering stages. In some embodiments, such other filtering stages can be used to modify a response of a digital filtering processing path.

Figure 18:
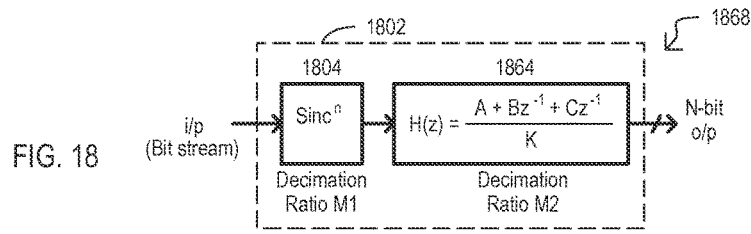
FIG. 18 is a block diagram of configurable compensation filtering according to embodiments.

FIG. 18 is a block diagram of a filter processing path 1868 showing how a post sinc filter stage can be used to compensate for undesired features of the sinc filter. Processing path 1868 can include a sinc filter 1804 and a compensating stage 1864. It is understood that both sinc filter 1804 and compensating stage 1864 can be formed with configurable filter section 1802. In some embodiments, compensating stage 1864 can be a configurable finite impulse response (FIR) filter.

In a very particular embodiment, a compensating stage (e.g., 1864) can be an FIR filter configured to compensate for "droop" in a frequency response of a sinc filter. As but one very particular example, the amplitude response of a sinc3 filter, used with a second order sigma-delta modulator in an oversampling ADC, can be "soggy" (it droops with frequency). This can reduce its suitability for applications where a flat frequency response is desired over part of the passband. A compensating FIR filter can be configured to flatten out the filter passband to give it a much closer match to the familiar Butterworth lowpass filter. In some embodiments, this can include implementing a 3-tap FIR filter with configurable integer-ratio coefficients using circuit blocks/sections from the configurable filter section to form all, or part of the FIR filter.

Thus, according to embodiments, FIR filters can be realized with configurable filter components with frequency responses that can compensate for the droop of a $sinc^L$ filter (sinc filters of various orders). Such an FIR filter can be realized with unused arithmetic/logic circuits (e.g., ALUs) or resources (time shift available accesses to an arithmetic/logic resource). Thus, an IC device can have a programmable filter block, which not only performs filtering as described thus far but also can re-configure itself to partly do $sinc^L$ filtering and also post process it with additional FIR filtering.

In this way, according to embodiments, an IC device can include a configurable filter section with multi-function capabilities as described herein, along with a programmable FIR selection.

As but one very particular embodiment, an example of one possible transfer function for a FIR filter can be:

$$\frac{(\alpha - Z^{-1})(\alpha - Z^{-1})}{K} = \frac{\alpha^2 - 2\alpha Z^{-1} + Z^{-2}}{K}$$

Further, the FIR filter can have unity gain at DC. This means α2−2α+1=K, which solves to:

α=1±√K

As an example, we can pick a positive integer for K. If we pick K=94, then α=9, and the FIR filter transfer function can be:

$$H(z) = \frac{81 - 18z^{-1} + z^{-2}}{64}$$

The integer components for coefficients can be realized with shift and add operations.

Figure 19:
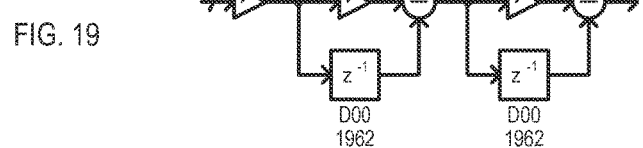
FIG. 19 is a block diagram of a compensating filter according to one embodiment.

FIG. 19 is a diagram showing one possible implementation of an FIR filter that can follow an existing differentiator architecture, but can include gain stages 1966-0 to -2. It is understood that gain values for such gain stages (1966-0 to -2) can be programmable to arrive at a desired frequency response.

While embodiments can include separable and combinable sinc filters of various orders, according to other embodiments, such filters can be further modified arrive a desired frequency response. In some embodiments, filter stages can be modified with gain terms to enable the placement of filter zeros. In some applications, this can enable better anti-aliasing.

A transfer function for an Nth order cascaded-integrator-comb (CIC) filter, which includes sinc filters, is given by:

$$H(z) = \frac{(1-z^{-M})^N}{M^N(1-z^{-1})^N}$$

where M is an oversampling ratio (e.g., decimation ratio).

Figure 20:
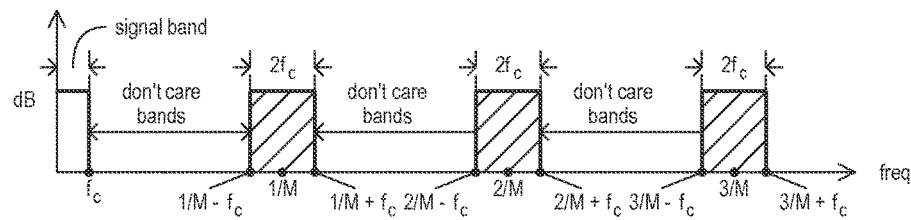
FIG. 20 is a band diagram of an ideal cascaded-integrator-comb (CIC) filter.

FIG. 20 shows the folding bands of an ideal CIC filter (at 1/M, 2/M, etc.). Folding bands are frequency ranges where one would expect the filter to reject any information. If such an ideal response could be achieved, the CIC filter would have very good antialiasing capabilities.

However, in reality, a CIC filter can have a zero at only certain of the frequencies f/M. According to embodiments, configurable filters can be modified to place zeros at desired locations to increase quantization noise rejection, and hence improve antialiasing. Such zeros can be placed not only at the desired f/M locations, but around such locations as well.

As but one particular embodiment, a CIC filter (for example a sinc filter of Nth order with a decimation ratio of M) can be configured to have the transfer function:

$$H(z) = \frac{1-2\cos(\alpha 1 * M)z^{-M} + z^{-2M}}{1-2\cos(\alpha 1)z^{-1} + z^{-2}} \times \frac{1-2\cos(\alpha 3 * M)z^{-M} + z^{-2M}}{1-2\cos(\alpha 3)z^{-1} + z^{-2}} \times \frac{1}{M^N}$$

The terms $2\cos(\alpha 1 * M)$ and $2\cos(\alpha 3 * M)$ can be varied to provide filter zeros.

Figure 21:
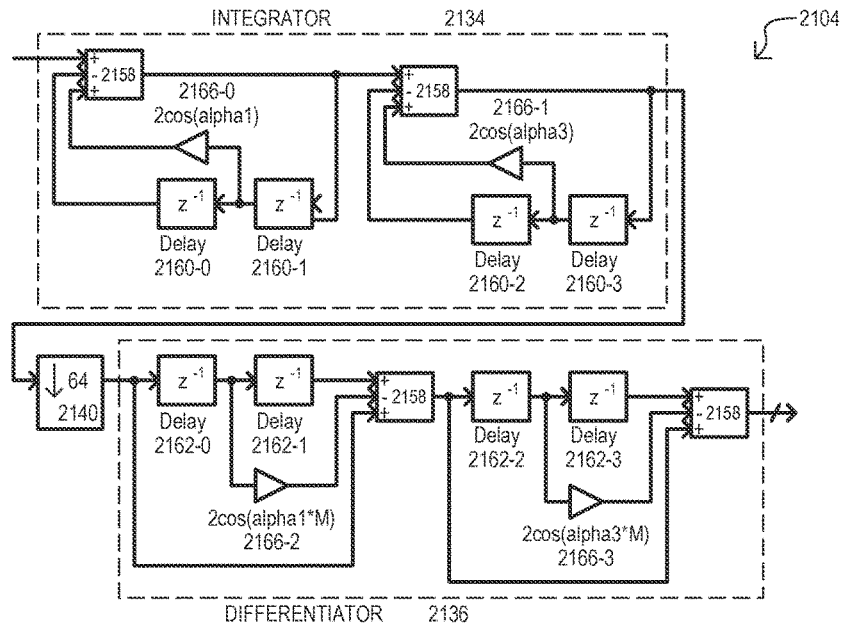
FIG. 21 is diagram showing a filter with adjustable zeros according to an embodiment.

One particular implementation of such a filter is shown in FIG. 21. FIG. 21 shows a modified filter 2104 having a structure that follows a sinc2 filter, but adds the capability of user defined zeros. Filter 2104 can include an integrator section 2134 and differentiator section 2136. Integrator section 2134 can include two stages, each including an arithmetic stage 2158, accumulator registers (e.g., 2160-0/1) (in z-transform representation), and in addition, a gain stage (e.g., 2166-0). A downsampler 2140 can apply the output of the integrator section 2134 to the differentiator section 2136. Like integrator section 2134, differentiator section 2136 can include two stages, each including an arithmetic stage 2158, registers (e.g., 2160-0/1) (in z-transform representation), and a gain stage (e.g., 2166-0).

It is understood that gain values of the gain stages (i.e., $2\cos \alpha 1$, $3\cos \alpha 1 * M$) can be programmable values, set by a user and/or application. As but one example, such a value can be established by configuration data issued from a processor or the like.

In the particular implementation shown, gain term $2(\cos \alpha 1 * M)$ and $2(\cos \alpha 3 * M)$ can reduce to $2\cos(q1*\pi)$ and $2\cos(q3*\pi)$, respectively. Thus, the differentiator would not have the decimation as part of the multiplying constant, while the integrator section would have the decimation as part of the constant term. In a particular embodiment, within the integrator sections, shifting and adding operations at the modulator data rate can be utilized to accomplish the gain stage.

In very particular embodiments, zeros can be placed to reject noise around 60 Hz (arising from power sources) for applications having relatively slow sampling rates.

As noted above, according to embodiments, digital filter circuits can be configured for various applications, including as post sigma-delta conversion filters in an oversampling ADC. However, the same digital filter circuits, or circuit components, can be configured for various other application, including both filtering and non-filtering applications. One such application can be a delta-sigma digital-to-analog converter (DAC).

Figure 22:
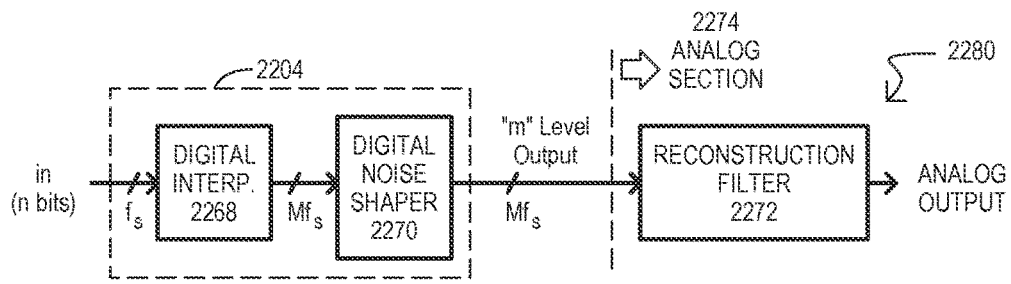
FIG. 22 is a diagram showing a delta-sigma digital-to-analog converter (DAC) according to an embodiment.

FIG. 22 shows an oversampled (delta-sigma) DAC system 2280 according to one particular embodiment. DAC system 2280 can include a digital interpolator filter 2268, digital noise shaper 2270, and reconstruction filter 2272. According to embodiments, digital interpolator filter 2268 and all, or a portion of digital noise shaper 2270 can be formed by resources of a configurable filter section 2204 as described herein and equivalents. It is understood that configurable filter section 2204 can also include sinc filters at the same time is include a digital interpolator filter 2268. In addition or alternatively, configurable filter section 2202 can be reconfigured from one state (e.g., one or more sinc filters) into a digital interpolator filter 2268.

A reconstruction filter 2272 can be formed from suitable analog circuits. In some embodiments, reconstruction filter 2272 can be formed with circuits in a same IC device as configurable filter section 2204. In particular embodiments, reconstruction filter 2272 can be formed by configurable analog circuits of the same IC device.

Referring still to FIG. 22, digital interpolation filter 2268 can receive input data values (in) of n-bits at a rate $f_s$, and upsample and filter them to output data values at the upsampled rate $Mf_s$. Digital noise shaper 2270 can noise shape (e.g., translate quantization noise to higher frequencies) and quantize the values to "m" bits, where m<n (and m can be 2). Reconstruction filter 2272 can then generate an analog waveform according to the stream of quantized output values provided by the digital noise shaper 2270. As but one very particular example, a digital interpolator filter (e.g., 2268) could upsample a 17-bit word at a rate 128 times the sample rate (i.e., M=128). The noise shaper could produce the "m" level output, which can be two in one example. This two level output can then be used by the reconstruction filter to create the analog output.

A digital interpolation filter 2268 can function as a moving average filter in addition to an upsampler. Such filtering can reduce the power of unneeded spectral replicas centered around the sampling frequency. In some embodiments, the digital interpolation filter 2268 can function as a sinc1 sample and hold to provide the desired upsampling. It is understood that the order and upsampling ratio (M) can be selected according to the analog architecture employed.

According to some embodiments, a digital interpolator filter 2268 can include, or be configured to include, any of: a moving average low pass filter that does not require a multiplier; configurable upsampling ratios in the same fashion as oversampling ratios as described herein; and interpolation by single or multiple, cascaded stages.

Figure 23:
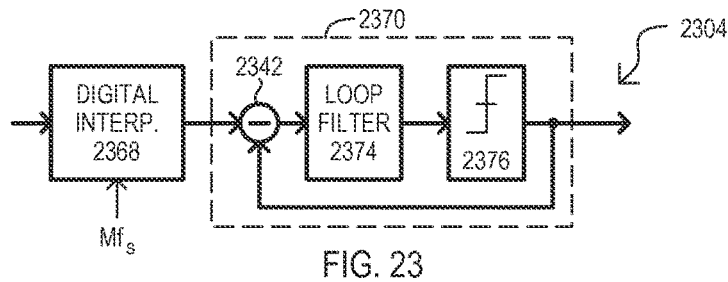
FIG. 23 is a block schematic diagram of sigma-delta DAC circuits according to an embodiment.

FIG. 23 shows a filter section 2304 configured into a digital interpolation filter 2368 and digital noise shaper 2370 according to one embodiment. Digital noise shaper 2370 can include a subtraction 2342, digital loop filter 2374, and quantizer 2376. Any or all of the sections can have configurable characteristics. For the digital interpolation filter 2368, any of the number of stages, interpolation type, filter type, and upsampling rate ($Mf_s$) can be changed based on configuration data. The characteristics of the loop filter 2374 can be changed in the same manner. A quantization level of quantizer 2376 can also be a configurable value.

Figure 24:
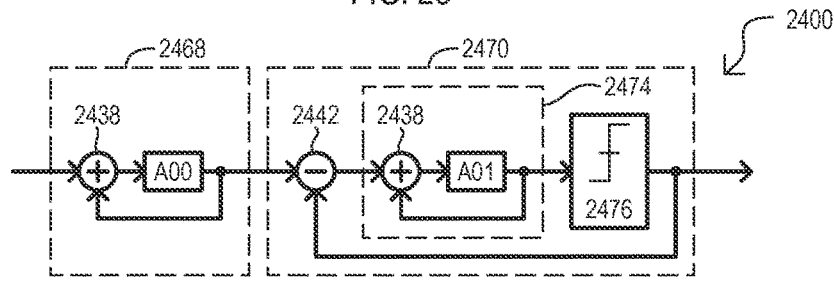
FIG. 24 is a block schematic diagram of sigma-delta DAC circuits according to another embodiment.

FIG. 24 shows one very particular implementation of the circuit shown in FIG. 23. A digital interpolation filter 2468 can include the same resources an integrator stage of a sinc filter (i.e., a register A00 and addition 2438). Similarly, a loop filter 2474 can also include the resources of an integrator stage. Subtraction 2442 is another resource commonly available (i.e., used in differentiator stages of a sinc filter).

Figure 25:
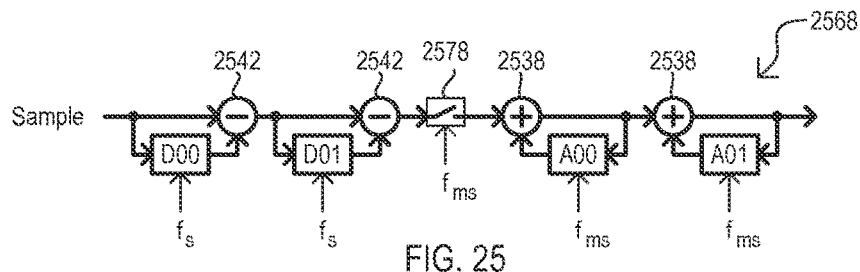
FIG. 25 is block diagram of a multi-stage digital interpolation filter according to an embodiment.

FIG. 25 shows a multi-stage digital interpolation filter 2568 that can be implemented in a configurable filter section according to embodiments. As shown, the filter as sinc filter 804 shown in FIG. 8. Differentiator stages (i.e., Comb filters) can be followed by integrator stages, with upsampling occurring at the input of the integrator section.

Reconfigurable digital filtering circuits and methods as disclosed herein can be used in combination with reconfigurable delta sigma modulators (with varying orders of analog modulation), to provide a circuits to meet the analog modulator's digital filtering requirements. This can include variable orders of decimation, as well as the ability to split and/or chain signal processing events. Such an arrangement, can enable the switching between different bit stream sources with respect to filtering, to reduce or eliminate latency in an ADC multiplexing configuration.

Reconfigurable digital filtering circuits and methods as disclosed herein can include various circuit blocks that are combinable to arrive at different filter types that are both separable and combinable. This can provide a wide variety of filter solutions without unduly large IC area. Further, by providing granularity in digital filter related processing blocks, for IC device with a corresponding CPU, code efficiency can be improved as numerous functions are executable/realizable with the reconfigurable circuit sections.

Embodiments herein can receive a bit-stream generated from an analog domain (either on the same IC device or from a source external to the IC device), and filter such a bit stream according to user demand. In particular embodiments, unique filtering requirements can be met, including those that specify filter order of decimation (e.g., $sinc^1$, $sinc^2$, $sinc^3$ or $sinc^L$), decimation ratio, level of quantization, and cascading (e.g., a sinc3 decimator followed by sinc1 decimator or several such combinations).

Embodiments herein can provide various $sinc^L$ type filters, and in addition, provide additional stages to alter the frequency response of such filters, including addressing pass-band "droop". Such additional processing can be programmable, being capable of setting adaptive decimation ratios and arriving at desired pass-band filter characteristics.

Embodiments herein can include circuit section that, in addition to forming digital filters, can be reconfigured into other circuit components, including but not limited to, interpolator circuits. Accordingly, the reconfigurable circuit sections can be used in a sigma-delta ADC (e.g., as sinc filter(s)) as well as a delta-signal DAC (e.g., as interpolator(s)). That is, the circuit sections are repurposable across various applications, including data converters.

Embodiments herein can include circuit section that can be reconfigured into multiplier-less architectures (i.e., interpolators, integrators of sinc filters). However, in some embodiments, such circuit sections can include multipliers. Multipliers can be used in filters to enable an adjustment of the frequency response of a signal processing path, including the placement of zeros according to multiplier values. In particular embodiments, such filters can enable complex-zeros to be located inside folding bands (where there may be no filtering, or insufficient filtering).

Just as embodiments can include circuit sections configurable into processing paths that can add zeros to a frequency response, in addition or alternatively, circuit sections can be configured to cancel zeros arising from previous blocks in the signal path(s). As but one example, circuit sections can be configured into a digital resonator which can cancel one or more zeros. A digital resonator can include an ALU circuit operating as a subtractor, with a feedback loop of clocked registers.

While embodiments have shown how digital processing paths can be created with digital configurable circuits, it is understood that all or portions of the filtering schemes described herein could be formed with fixed digital circuits, or code executed by a processor. As but two examples, alternate embodiments could have fixed front end sinc filters that can be chained with other filters formed with reconfigurable filter circuits. In addition or alternatively, a first portion of filtering can be achieved with configurable filter circuits as described herein, with subsequent filtering performed by a processor executing instructions (e.g., firmware).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An integrated circuit (IC) device, comprising:
   at least one input;
   at least one output configured to provide a multi-bit output value;
   a plurality of configurable digital filter circuits; and
   switch circuits coupled to the at least one input and to the at least one output, the switch circuits configurable to connect, in series, the same digital filter circuits as a single processing path between the at least one input and the at least one output or as separate processing paths between the at least one input and the at least one output;

wherein the switch circuits are coupled to a configuration data input, and wherein the switch circuits are configured to enable and disable the single processing path and the separate processing paths according to configuration data received at the configuration data input;

wherein the same digital filter circuits have different characteristics when configured as the single processing path than when configured as the separate processing paths, and wherein the different characteristics include a decimation order or a decimation ratio.

2. The IC device of claim 1, further including:
a sigma-delta modulator circuit configured to receive an analog input signal and provide a modulated output signal corresponding to the analog input signal; and
the at least on input is configured to receive the modulated output signal.

3. The IC device of claim 1, further including:
an input multiplexer (MUX) having at least a first MUX input coupled to an external connection to the IC device, a second MUX input coupled to a sigma-delta modulator circuit of the IC device, a third MUX input coupled to another circuit of the IC device, and a MUX output coupled to the at least one input.

4. The IC device of claim 1, wherein:
the at least one output includes a plurality of outputs, each configured to provide its own multi-bit output value; and
the switch circuits are configurable to connect the configurable digital filter circuits into separate, parallel, digital processing paths, each coupled to a different output and to connect digital filter circuits in series with one another.

5. The IC device of claim 1, wherein:
the configurable digital filter circuits are configurable into sinc filter circuits, each having an order and down sampling rate.

6. The IC device of claim 1, wherein:
the configurable digital filter circuits include a plurality of different circuit sections configurable for interconnection with one another by the switch circuits to form different digital filter circuit types or different numbers of digital filter circuits.

7. The IC device of claim 6, wherein:
the different circuit sections include multi-bit registers configured to receive and output multi-bit values in parallel with one another, multi-bit arithmetic logic units (ALUs), and frequency divider circuits.

8. The IC device of claim 7, wherein:
the different circuit sections are configurable into sinc filter circuits, the order of a sinc filter being configurable according to series connected register stages, a decimation ratio of a sinc filter being configurable according to a down sample frequency.

9. The IC device of claim 7, wherein:
the different circuit sections further include programmable multiplier sections configurable for interconnection with other of the circuit sections; and
the multiplier sections are configurable for inclusion into digital filter circuits to add zeros with respect to a frequency response of the digital filter circuits according to programmable multiplier values.

10. The IC device of claim 7, wherein:
the different circuit sections are further configurable into finite impulse response filters configured to modify a frequency response of other filters formed with the different circuit sections.

11. The IC device of claim 7, wherein:
the different circuit sections are further configurable into non-filter circuits.

12. The IC device of claim 11, further including:
a reconstruction filter circuit coupled to the different circuit sections and configured to generate an analog output signal in response to a multi-bit digital value from the different circuit sections;
wherein the non-filter circuit and the reconstruction filter circuit form at least part of an oversampling digital-to-analog converter.

13. A method for implementing digital filtering functions in an integrated circuit (IC) device, the method comprising:
receiving configuration data at a configuration data input in the IC device; and
in response to the configuration data, configuring in series a plurality of digital filter circuit sections into a single processing path or separate processing paths, wherein the configuring includes enabling and disabling the single processing path and the separate processing paths according to the configuration data;
wherein the plurality of digital filter circuit sections have different characteristics when configured into the single processing path than when configured into the separate processing paths, and wherein the different characteristics include a decimation order or a decimation ratio;
wherein the processing paths are connected between at least one input and at least one output configured to provide a multi-bit output value and are formed in the IC device.

14. The method of claim 13, wherein:
configuring the plurality of digital filter circuit sections includes configuring switch circuits that interconnect digital filter circuit components to one another;
wherein the digital filter circuit components are selected from the group of registers and at least one arithmetic logic circuit.

15. The method of claim 13, wherein:
the configurable digital filter circuits are configurable into any of a plurality of sinc filters, each having a selectable order and decimation ratio.

16. The method of claim 13, further including:
the plurality of digital filter sections are configured into a plurality of separate processing paths; and
multiplexing data values received at the same input between different ones of the processing paths.

17. The method of claim 13, further including:
sigma-delta modulating an analog input value to generate a modulated signal; and
digitally filtering the modulated signal with at least one of the processing path to generate an analog-to-digital conversion value corresponding to the analog input value.

18. A method, comprising:
receiving at least one modulated input bit stream;
filtering the at least one input bit stream with digital filter circuits configured from a plurality of different circuit sections interconnected in series with one another by switch circuits according to configuration data received at a configuration data input into a single processing path or separate processing paths, wherein the single processing path and the separate processing paths are enabled and disabled according to the configuration data;

providing multi-bit filter output data from the digital filter circuits on at least one output;

wherein characteristics of the digital filter circuits are configurable and include a decimation order or a decimation ratio, and the circuit sections include clocked registers and at least one arithmetic logic unit; and wherein the characteristics of the digital filter circuits when configured into the single processing path are different from the characteristics of the digital filter circuits when configured into the separate processing paths.

19. The method of claim 18, wherein:

receiving at least one modulated input bit stream includes receiving a bit stream from a sigma-delta modulator;

filtering the at least one input bit stream includes filtering with at least one sinc filter.

20. The method of claim 18, wherein:

filtering the at least one input bit stream includes filtering with at least one sinc filter, and a second digital filter configured to modify a frequency response corresponding to data values output from the at least one sinc filter;

wherein the characteristics of the second digital filter are configurable and the circuit sections further include multipliers with configurable gain terms.

* * * * *